(12) United States Patent
Lin et al.

(10) Patent No.: US 10,438,934 B1
(45) Date of Patent: Oct. 8, 2019

(54) PACKAGE-ON-PACKAGE STRUCTURE AND MANUFACTURING METHOD THEREOF

(71) Applicant: Taiwan Semiconductor Manufacturing Co., Ltd., Hsinchu (TW)

(72) Inventors: Shih-Ting Lin, Taipei (TW); Chin-Fu Kao, Taipei (TW); Jing-Cheng Lin, Hsinchu (TW); Li-Hui Cheng, New Taipei (TW); Szu-Wei Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/979,494

(22) Filed: May 15, 2018

(51) Int. Cl.
*H01L 23/48* (2006.01)
*H01L 23/52* (2006.01)
*H01L 25/10* (2006.01)
*H01L 25/00* (2006.01)
*H01L 23/538* (2006.01)
*H01L 21/56* (2006.01)
*H01L 21/48* (2006.01)

(52) U.S. Cl.
CPC .......... *H01L 25/105* (2013.01); *H01L 21/481* (2013.01); *H01L 21/486* (2013.01); *H01L 21/4857* (2013.01); *H01L 21/568* (2013.01); *H01L 23/5383* (2013.01); *H01L 23/5389* (2013.01); *H01L 25/50* (2013.01); *H01L 2225/1035* (2013.01); *H01L 2225/1041* (2013.01); *H01L 2225/1058* (2013.01)

(58) Field of Classification Search
CPC .......... H01L 25/0657; H01L 21/76898; H01L 23/5226; H01L 2225/06513; H01L 25/105; H01L 21/486; H01L 21/568; H01L 2924/18161; H01L 21/76834; H01L 21/4853; H01L 21/56; H01L 21/563; H01L 21/481; H01L 21/4857
USPC ....................................... 257/774
See application file for complete search history.

(56) References Cited

U.S. PATENT DOCUMENTS

| 9,000,584 B2 | 4/2015 | Lin et al. |
| 9,048,222 B2 | 6/2015 | Hung et al. |
| 9,048,233 B2 | 6/2015 | Wu et al. |

(Continued)

*Primary Examiner* — Theresa T Doan
(74) *Attorney, Agent, or Firm* — JCIPRNET

(57) ABSTRACT

A package-on-package structure including a first and second package is provided. The first package includes a semiconductor die, through insulator vias, an insulating encapsulant, conductive terminals and a redistribution layer. The semiconductor die has a die height H1. The plurality of through insulator vias is surrounding the semiconductor die and has a height H2, and H2<H1. The insulating encapsulant is encapsulating the semiconductor die and the plurality of through insulator vias, wherein the insulating encapsulant has a plurality of via openings revealing each of the through insulator vias. The plurality of conductive terminals is disposed in the via openings and electrically connected to the plurality of through insulator vias. The redistribution layer is disposed on the active surface of the semiconductor die and over the insulating encapsulant. The second package is stacked on the first package and electrically connected to the plurality of conductive terminals of the first package.

20 Claims, 16 Drawing Sheets

(56) References Cited

U.S. PATENT DOCUMENTS

| | | |
|---|---|---|
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2018/0315733 A1* | 11/2018 | Lin .................. H01L 24/81 |

* cited by examiner

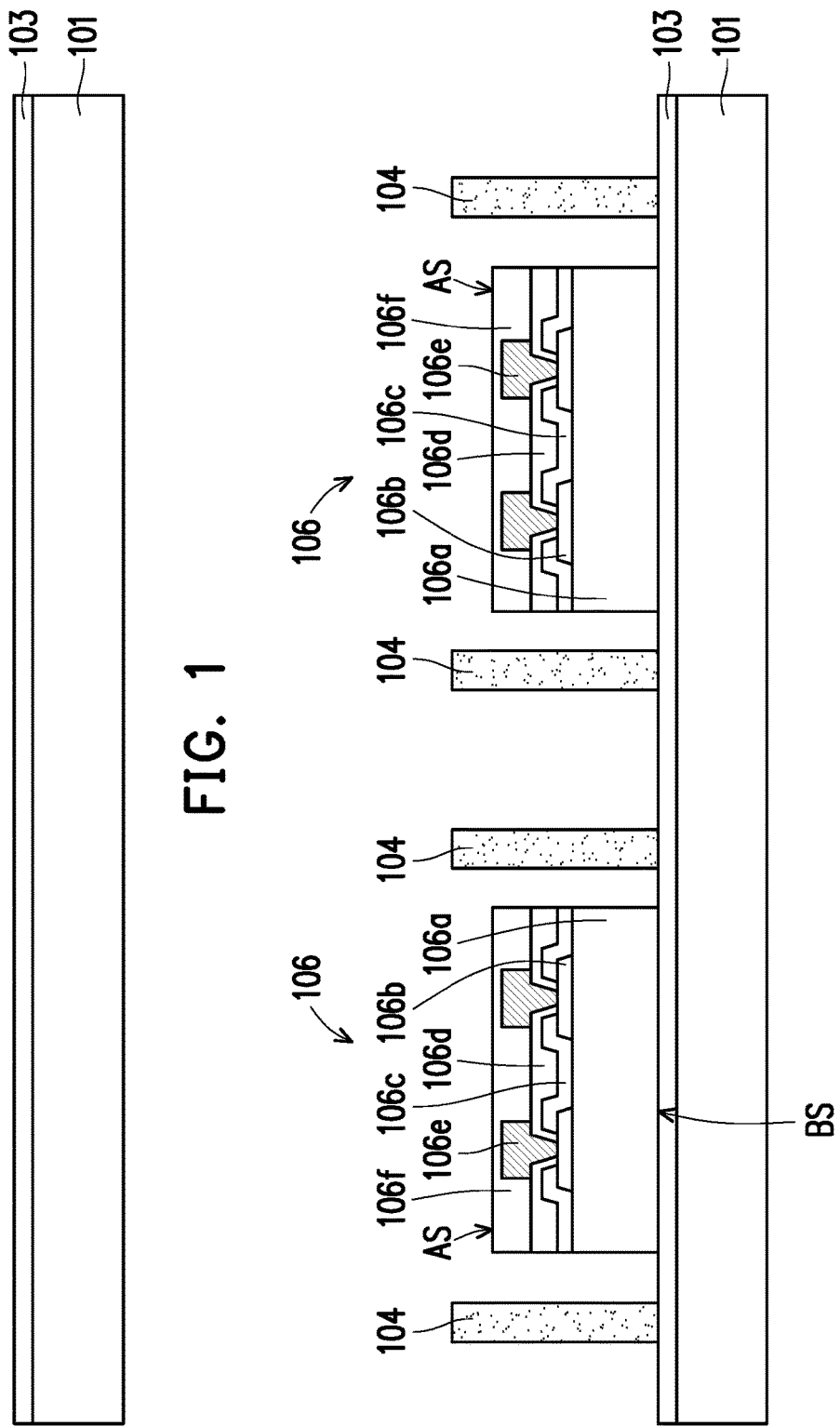

PACKAGE-ON-PACKAGE STRUCTURE AND MANUFACTURING METHOD THEREOF

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 10 are schematic cross-sectional views of various stages in a manufacturing method of a package-on-package (PoP) structure according to some exemplary embodiments of the present disclosure.

DETAILED DESCRIPTION

Figure 3:
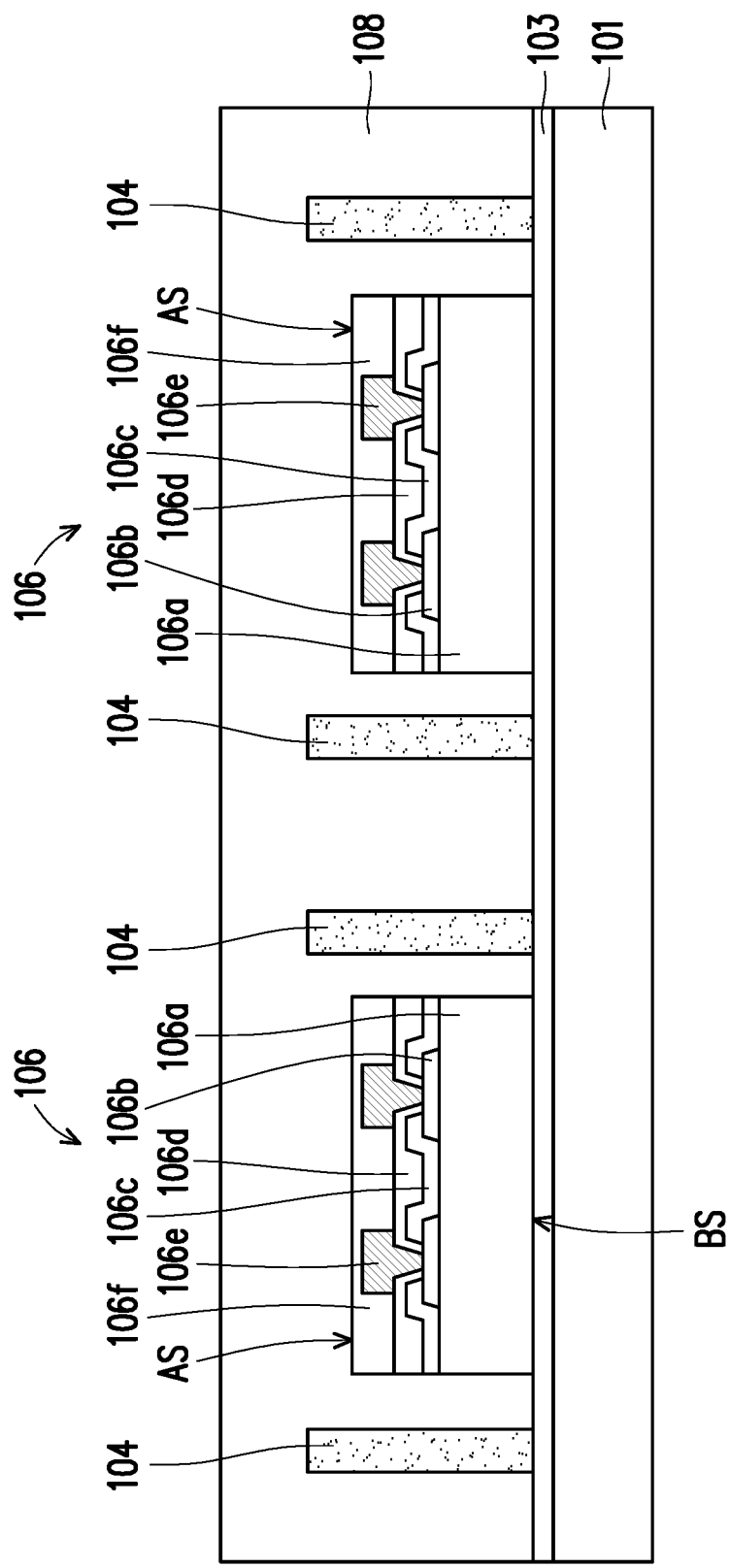

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 10 are schematic cross-sectional views of various stages in a manufacturing method of a package-on-package (PoP) structure according to some exemplary embodiments of the present disclosure. Referring to FIG. 1, a carrier 101 with a de-bonding layer 103 coated thereon is provided. In some embodiments, the carrier 101 may be a glass carrier or any suitable carrier for carrying a semiconductor wafer or a reconstituted wafer used for the manufacturing method of the package-on-package structure. In some embodiments, the de-bonding layer 103 may be any material suitable for bonding and de-bonding the carrier 101 from the above layer(s) or any wafer(s) disposed thereon.

In some embodiments, the de-bonding layer 103 may include a dielectric material layer made of a dielectric material including any suitable polymer-based dielectric material (such as benzocyclobutene ("BCB"), polybenzoxazole ("PBO")). In an alternative embodiment, the de-bonding layer 103 may include a dielectric material layer made of an epoxy-based thermal-release material, which loses its adhesive property when heated, such as a light-to-heat-conversion (LTHC) release coating film. In a further alternative embodiment, the de-bonding layer 103 may include a dielectric material layer made of an ultra-violet (UV) glue, which loses its adhesive property when exposed to UV lights. In certain embodiments, the de-bonding layer 103 may be dispensed as a liquid and cured, or may be a laminate film laminated onto the carrier 101. In certain embodiments, the de-bonding layer 103 is, for example, a LTHC layer with good chemical resistance, and such layer enables room temperature de-bonding from the carrier 101 by applying laser irradiation.

Referring to FIG. 2, after providing the carrier 101 and the de-bonding layer 103, a plurality of through insulator vias 104 is formed on the de-bonding layer 103 and over the carrier 101, and a plurality of semiconductor dies 106 is provided on the de-bonding layer 103. In some embodiments, the through insulator vias 104 are through integrated fan-out ("InFO") vias. In one embodiment, the formation of the through insulator vias 104 includes forming a mask pattern (not shown) with openings, then forming a metallic material (not shown) filling up the openings by electroplating or deposition, and removing the mask pattern to form the through insulator vias 104 on the carrier 101. The material of the mask pattern may include a positive photo-resist or a negative photo-resist. In one embodiment, the material of the through insulator vias 104 may include a metal material such as copper or copper alloys, or the like. However, the disclosure is not limited thereto.

In an alternative embodiment, the through insulator vias 104 may be formed by forming a seed layer (not shown) on the de-bonding layer 103; forming the mask pattern with openings exposing portions of the seed layer; forming the metallic material on the exposed portions of the seed layer to form the through insulator vias 104 by plating; removing the mask pattern; and then removing portions of the seed layer exposed by the through insulator vias 104. For example, the seed layer may be a titanium/copper composited layer. For simplification, only four through insulator vias 104 are illustrated in FIG. 2. However, it should be noted that the number of through insulator vias 104 is not limited thereto, and can be selected based on requirement Furthermore, as illustrated in FIG. 2, one or more semiconductor dies 106 may be picked and placed on the de-bonding layer 103. In certain embodiments, each of the semiconductor dies 106 have an active surface AS, and a backside surface BS opposite to the active surface AS. For example, the backside surface BS of the semiconductor dies 106 may be attached to the de-bonding layer 103 through a die attach film (not shown). By using the die attach film, a better adhesion between the semiconductor dies 106 and the de-bonding layer 103 is ensured. In the exemplary embodiment, only two semiconductors dies 106 are illustrated, however, the disclosure is not limited thereto. In other embodiments, the number of semiconductor dies disposed on the carrier 101 may be adjusted based on product requirement.

In the exemplary embodiment, each of the semiconductor dies 106 includes a semiconductor substrate 106a, a plurality of conductive pads 106b, a passivation layer 106c, a post passivation layer 106d, a plurality of conductive posts or conductive vias 106e, and a protection layer 106f. As illustrated in FIG. 2, the plurality of conductive pads 106b is disposed on the semiconductor substrate 106a. The passivation layer 106c is formed over the semiconductor substrate 106a and has openings that partially expose the conductive pads 106b on the semiconductor substrate 106a. The semiconductor substrate 106a may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 106b may be aluminum pads, copper pads or other suitable metal pads. The passivation layer 106c may be a silicon oxide layer, a silicon nitride layer, a silicon oxynitride layer or a dielectric layer formed of any suitable dielectric materials. Furthermore, in some embodiments, the post-passivation layer 106d is optionally formed over the passivation layer 106c. The post-passivation layer 106d covers the passivation layer 106c and has a plurality of contact openings. The conductive pads 106b are partially exposed by the contact openings of the post passivation layer 106d. The post-passivation layer 106d may be a benzocyclobutene (BCB) layer, a polyimide layer, a polybenzoxazole (PBO) layer, or a dielectric layer formed by other suitable polymers. In some embodiments, the conductive posts or conductive vias 106e are formed on the conductive pads 106b by plating. In some embodiments, the protection layer 106f is formed on the post passivation layer 106d covering the conductive posts or conductive vias 106e so as to protect the conductive posts or conductive vias 106e.

In some embodiments, the semiconductor dies 106 placed on the de-bonding layer 103 may be arranged in an array, and when the semiconductor dies 106 are arranged in an array, the through insulator vias 104 may be classified into groups. The number of the semiconductor dies may correspond to the number of the groups of the through insulator vias 104. In the illustrated embodiment, the semiconductor dies 106 may be picked and placed on the de-bonding layer 103 after the formation of the through insulator vias 104. However, the disclosure is not limited thereto. In some alternative embodiments, the semiconductor dies 106 may be picked and placed on the de-bonding layer 103 before the formation of the through insulator vias 104.

Referring to FIG. 3, an insulating material 108 is formed on the de-bonding layer 103 and over the semiconductor dies 106. In some embodiments, the insulating material 108 is formed through, for example, a compression molding process, filling up the gaps between the semiconductor dies 106 and encapsulating the semiconductor dies 106. The insulating material 108 also fills up the gaps between adjacent through insulator vias 104 to encapsulate the through insulator vias 104. The conductive posts or conductive vias 106e and the protection layer 106f of the semiconductor dies 106 are encapsulated by and well protected by the insulating material 108. In other words, the conductive posts or conductive vias 106e and the protection layer 106f of the semiconductor dies 106 are not revealed and are well protected by the insulating material 108.

In some embodiments, the insulating material 108 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 108 may include an acceptable insulating encapsulation material. In some embodiments, the insulating material 108 may further include inorganic filler or inorganic compound (e.g. silica, clay, and so on) which can be added therein to optimize coefficient of thermal expansion (CTE) of the insulating material 108. The disclosure is not limited thereto.

Figure 4:
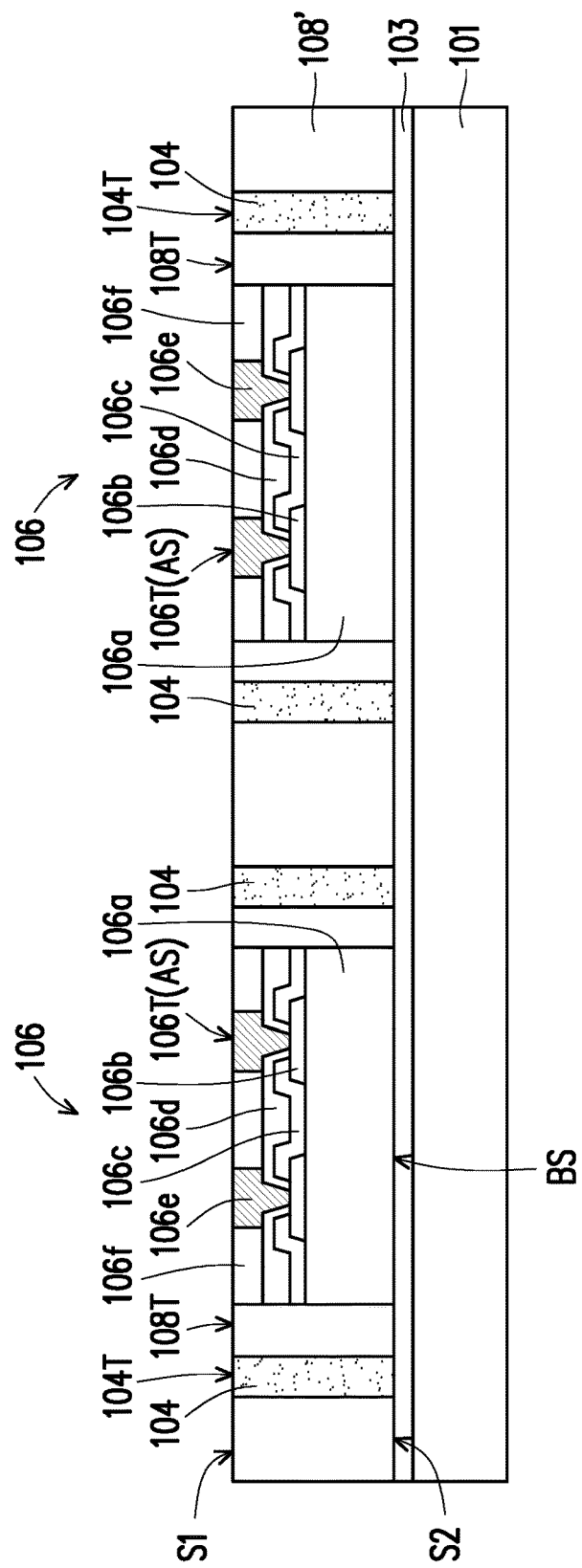

Referring to FIG. 4, in some embodiments, the insulating material 108 is partially removed to expose the conductive posts 106e and the through insulator vias 104. In some embodiments, the insulating material 108 and the protection layer 106f are ground or polished by a planarization step. For example, the planarization step is performed through a mechanical grinding process and/or a chemical mechanical polishing (CMP) process until the top surfaces 106T (or active surface AS) of the conductive posts 106e are revealed. In some embodiments, the through insulator vias 104 may be partially polished so that the top surfaces 104T of the through insulator vias 104 are levelled with the top surfaces 106T of the conductive posts 106e, or levelled with the active surface AS of the semiconductor dies 106. In other words, the conductive posts 106e and the through insulator vias 104 may also be slightly grinded/polished.

In the illustrated embodiment, the insulating material 108 is polished to form an insulating encapsulant 108'. The insulating encapsulant 108' may have a first surface S1, and a second surface S2 opposite to the first surface S1. For example, the second surface S2 of the insulating encapsulant 108' is in contact with the de-bonding layer 103. In some embodiments, the top surface 108T (or first surface S1) of the insulating encapsulant 108', the top surface 104T of the through insulator vias 104, the top surface 106T of the conductive posts 106e, and the top surface of the polished protection layer 106f are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 5:
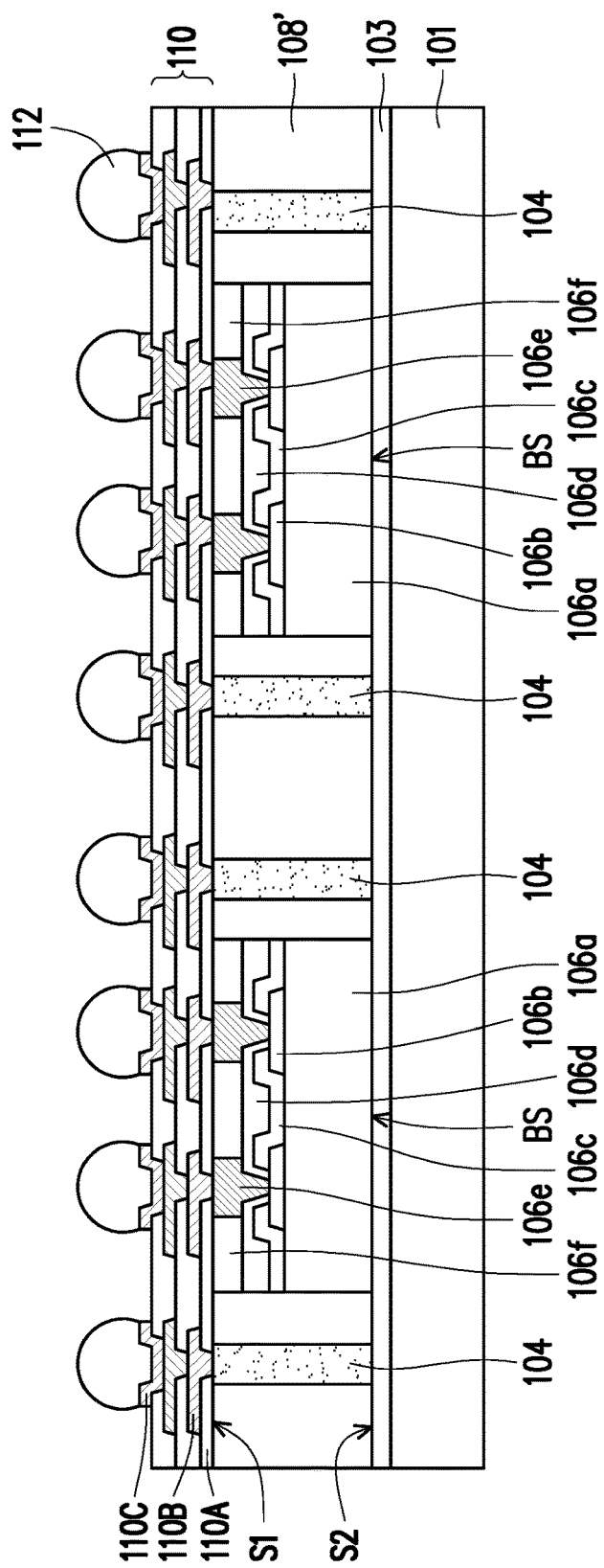

Referring to FIG. 5, after the planarization step, a redistribution layer 110 is formed on the insulating encapsulant 108, the through insulator vias 104 and the semiconductor dies 106. As shown in FIG. 5, the redistribution layer 110 is formed on the top surface 104T of the through insulator vias 104, on the top surfaces 106T of the conductive posts 106e, and on the top surface 108T (or first surface S1) of the insulating encapsulant 108'. In some embodiments, the redistribution layer 110 is electrically connected to the through insulator vias 104, and is electrically connected to the semiconductor dies 106 through the conductive posts 106e. In some embodiments, the semiconductor dies 106 are electrically connected to the through insulator vias 104 through the redistribution layer 110.

In some embodiments, the formation of the redistribution layer 110 includes sequentially forming one or more dielectric layers 110A, and one or more metallization layers 110B in alternation. In certain embodiments, the metallization layers 110B are sandwiched between the dielectric layers 110A. Although only two layers of the metallization layers 110B and three layers of dielectric layers 110A are illustrated herein, however, the scope of the disclose is not limited by the embodiments of the disclosure. In other embodiments, the number of metallization layers 110B and the dielectric layers 110A may be adjusted based on product requirement. In some embodiments, the metallization layers 110B are electrically connected to the conductive posts 106e of the semiconductor dies 106. Furthermore, the metallization layers 110B are electrically connected to the through insulator vias 104.

In certain embodiments, the material of the dielectric layers 110A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 110A are formed by suitable fabrication techniques such as spin-on coating, chemical vapor deposition (CVD), plasma-enhanced chemical vapor deposition (PECVD) or the like. The disclosure is not limited thereto.

In some embodiments, the material of the metallization layer 110B may be made of conductive materials formed by electroplating or deposition, such as aluminum, titanium, copper, nickel, tungsten, and/or alloys thereof, which may be patterned using a photolithography and etching process. In some embodiments, the metallization layer 110B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

After forming the redistribution layer 110, a plurality of conductive pads 110C may be disposed on an exposed top surface of the topmost layer of the metallization layers 110B for electrically connecting with conductive balls. In certain embodiments, the conductive pads 110C are for example, under-ball metallurgy (UBM) patterns used for ball mount. As shown in FIG. 5, the conductive pads 110C are formed on and electrically connected to the redistribution layer 110. In some embodiments, the materials of the conductive pads 110C may include copper, nickel, titanium, tungsten, or alloys thereof or the like, and may be formed by an electroplating process, for example. The number of conductive pads 110C are not limited in this disclosure, and may be selected based on the design layout. In some alternative embodiments, the conductive pads 110C may be omitted. In other words, conductive balls 112 formed in subsequent steps may be directly disposed on the redistribution layer 110.

As illustrated in FIG. 5, after forming the conductive pads 110C, a plurality of conductive balls 112 is disposed on the conductive pads 110C and over the redistribution layer 110. In some embodiments, the conductive balls 112 may be disposed on the conductive pads 110C by a ball placement process or reflow process. In some embodiments, the conductive balls 112 are, for example, solder balls or ball grid array (BGA) balls. In some embodiments, the conductive balls 112 are connected to the redistribution layer 110 through the conductive pads 110C. In certain embodiments, some of the conductive balls 112 may be electrically connected to the semiconductor dies 106 through the redistribution layer 110. Furthermore, some of the conductive balls 112 may be electrically connected to the through insulator vias 104 through the redistribution layer 110. The number of the conductive balls 112 is not limited to the disclosure, and may be designated and selected based on the number of the conductive pads 110C.

Figure 6:
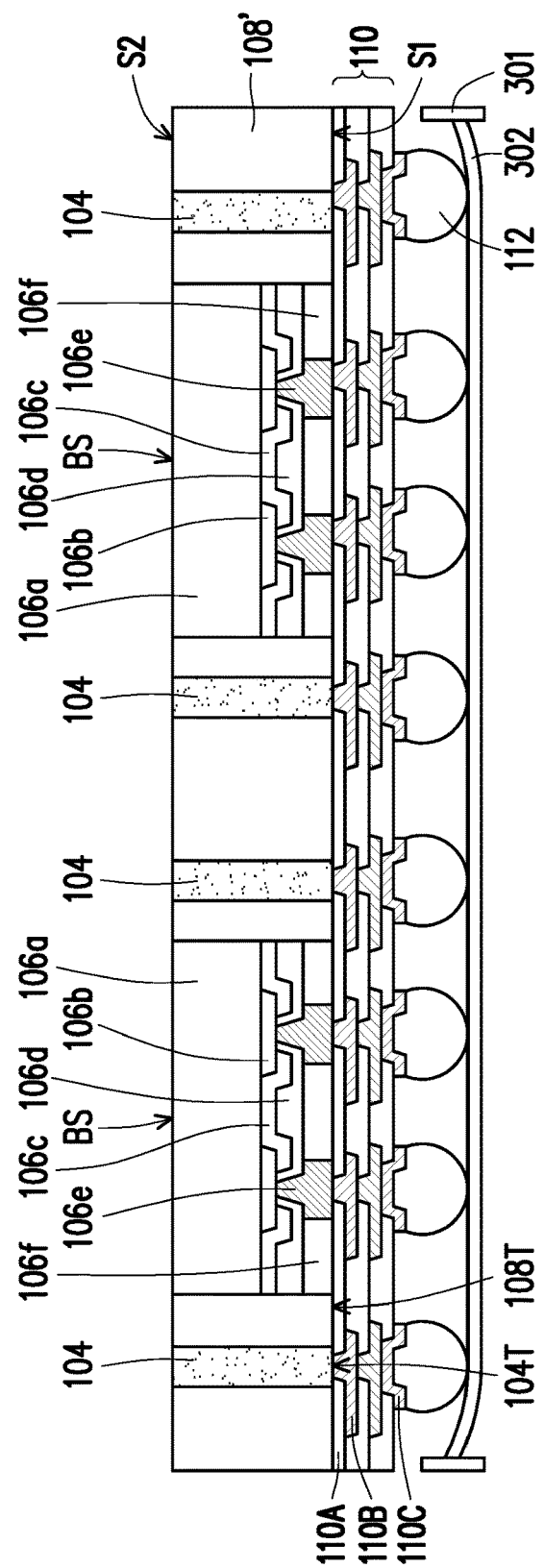

Referring to FIG. 6, in some embodiments, after forming the redistribution layer 110 and the conductive balls 112, the structure shown in FIG. 5 may be turned upside down and attached to a tape 302 supported by a frame 301. Subsequently, the carrier 101 may be de-bonded so as to separate the semiconductor dies 106 and the through insulator vias 104 from the carrier 101. In the exemplary embodiment, the de-bonding process includes projecting a light such as a laser light or an UV light on the de-bonding layer 103 (e.g., the LTHC release layer), such that the carrier 101 can be easily removed. In certain embodiments, the de-bonding layer 103 may be further removed or peeled off to reveal the backside surface BS of the semiconductor dies 106, and to reveal the second surface S2 of the insulating encapsulant 108'.

Subsequently, referring to FIG. 7A, portions of the through insulator vias 104 may be removed to form a plurality of via openings OP on the second surface S2 of the insulating encapsulant 108'. In some embodiments, an etching process is performed to remove a portion of the through insulator vias 104 and to reduce a height of the through insulator vias 104. In certain embodiments, the etching process might also remove a portion of the insulating encapsulant 108', but disclosure is not limited thereto. After performing the etching process, the remaining through insulator vias 104 has a width of W1, and the via openings OP has a maximum opening width of W2, wherein W1=W2. In other words, the maximum opening width W2 of the via openings OP substantially corresponds to the width W1 of the through insulator vias 104. As more clearly illustrated in a top view shown in FIG. 7B (top view of FIG. 7A), the via openings OP reveal each of the through insulator vias 104, while the via openings OP and the through insulator vias 104 have corresponding widths (W1=W2). However, the disclosure is not limited thereto. In alternative embodiments, the width W1 of the through insulator vias 104 may be smaller than the maximum opening width W2.

Figure 7A:
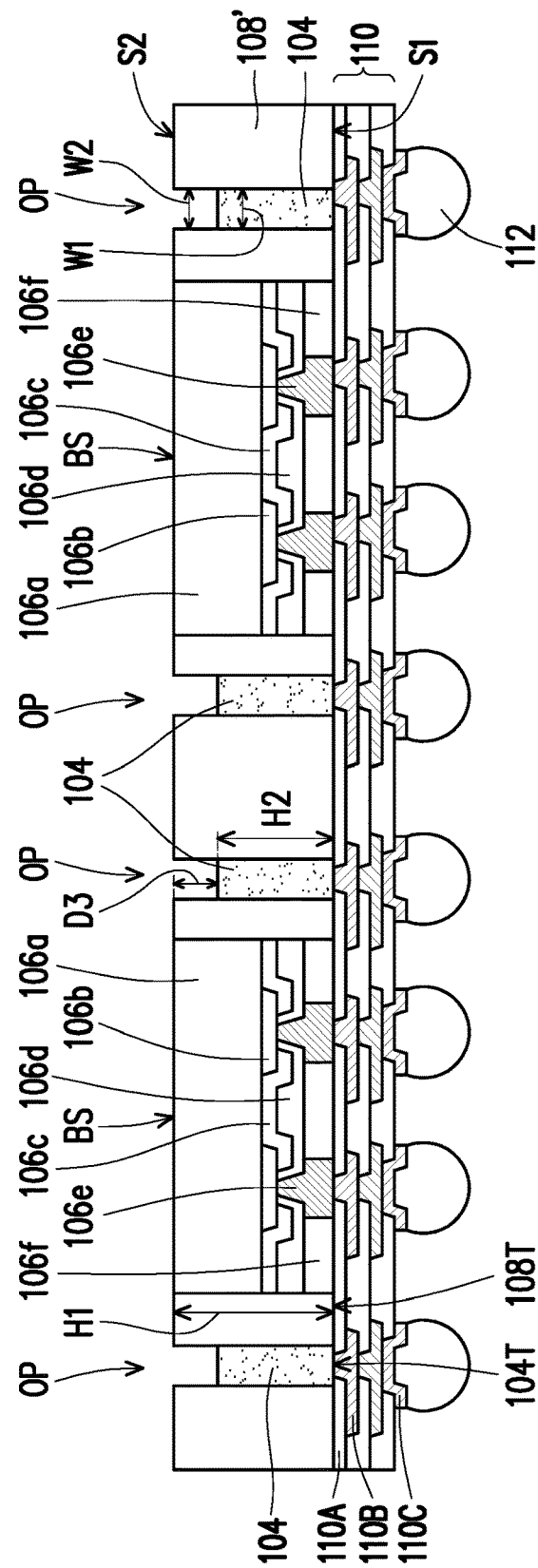
Figure 7B:
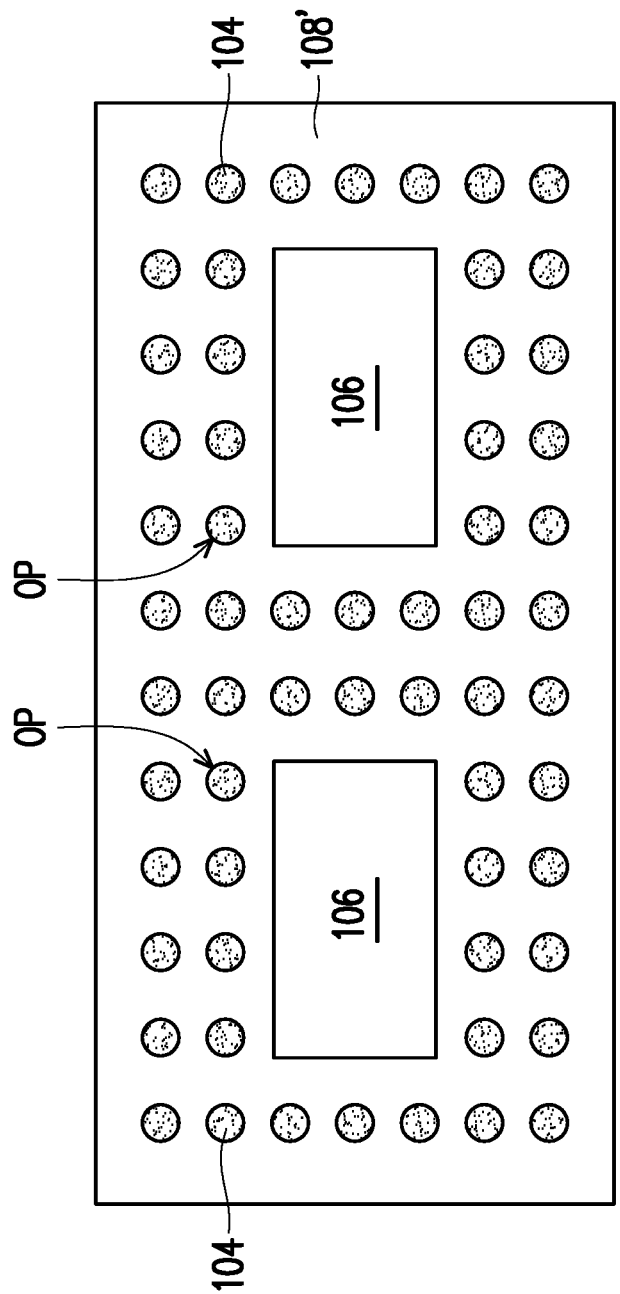

Furthermore, as illustrated in FIG. 7A, the semiconductor die 106 has a die height of H1 and the plurality of through insulator vias 104 has a height of H2, wherein H2<H1. In other words, the height of the through insulator vias 104 is made lower than the height of the semiconductor die 106. In certain embodiments, the height H2 of the through insulator vias 104 is also made lower than the height of the insulating encapsulant 108'. In some embodiments, the die height H1 of the semiconductor die 106 is in a range of 250 μm to 300 μm, which is greater than the height of conventional dies. The semiconductor die 106 having a die height in this range may be used to provide better heat dissipation. Additionally, in some embodiments, the plurality of via openings OP has a depth of D3, and the depth D3 may, for example, be in a range of 40 μm to 80 μm. In certain embodiments, a ratio of the die height H1 to the depth D3 is in a range of 1:0.13 to 1:0.32. By having the die height and opening depth maintained in this range, a thickness of the overall package-on-package structure may be reduced while good heat dissipation properties may be retained.

Figure 8:
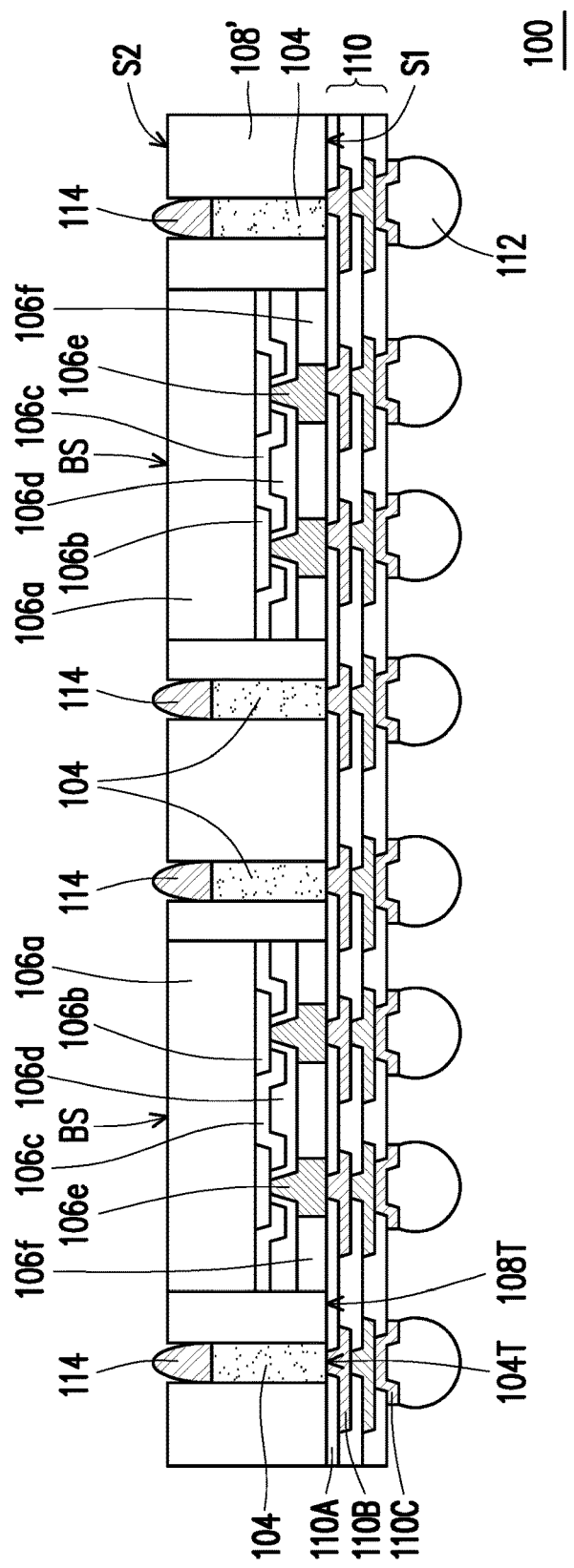

Referring to FIG. 8, after forming the via openings OP, a plurality of conductive terminals 114 is disposed in the via openings OP to provide backside connection. In some embodiments, the conductive terminals 114 are disposed in the via openings OP and electrically connected to the plurality of through insulator vias 104. In some embodiments, the conductive terminals 114 are, for example, reflowed to bond with the bottom surfaces of the through insulator vias 104. In certain embodiments, the conductive terminals 114 are electrically connected to the redistribution layer 110 through the through insulator vias 104. In some embodiments, the conductive terminals 114 may be surrounded by the insulating encapsulant 108'. As shown in FIG. 8, after providing the conductive terminals 114, a first package 100 having dual-side terminals may be accomplished.

Figure 9:
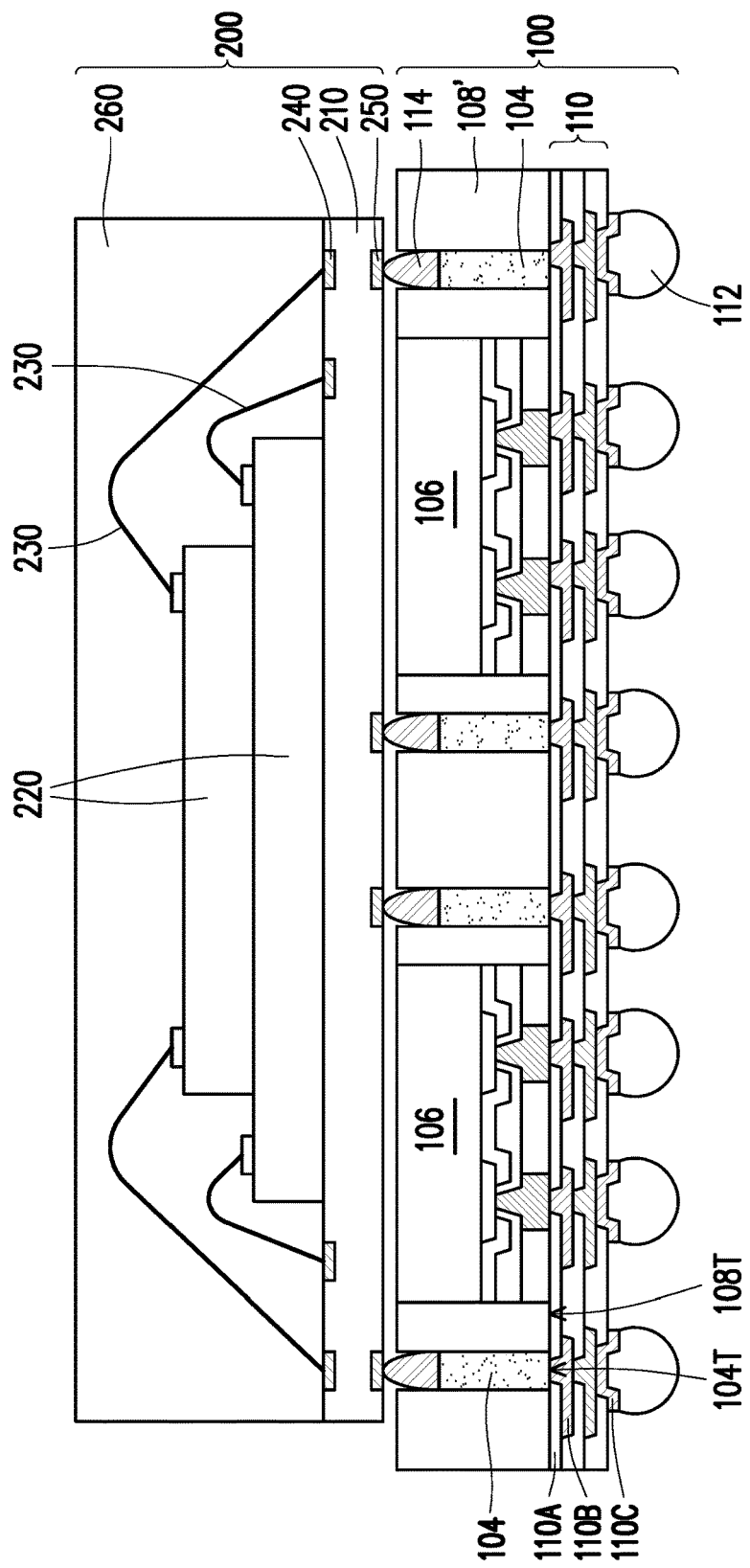

Referring to FIG. 9, after forming the first package 100, a second package 200 is provided and stacked on the first package 100. For example, the second package 200 is electrically connected to the plurality of conductive terminals 114 of the first package 100. In the exemplary embodiment, the second package 200 has a substrate 210, a plurality of semiconductor chips 220 mounted on one surface (e.g. top surface) of the substrate 210 and stacked on top of one another. In some embodiments, bonding wires 230 are used to provide electrical connections between the semiconductor chips 220 and pads 240 (such as bonding pads). In some embodiments, an insulating encapsulant 260 is formed to encapsulate the semiconductor chips 220 and the bonding wires 230 to protect these components. In some embodiments, through insulator vias (not shown) may be used to provide electrical connection between the pads 240 and conductive pads 250 (such as bonding pads) that are located on another surface (e.g. bottom surface) of the substrate 210. In certain embodiments, the conductive pads 250 are electrically connected to the semiconductor chips 220 through these through insulator vias (not shown). In some embodiments, the conductive pads 250 of the second package 200 are electrically connected to the conductive terminals 114 of the first package 100.

Figure 10:
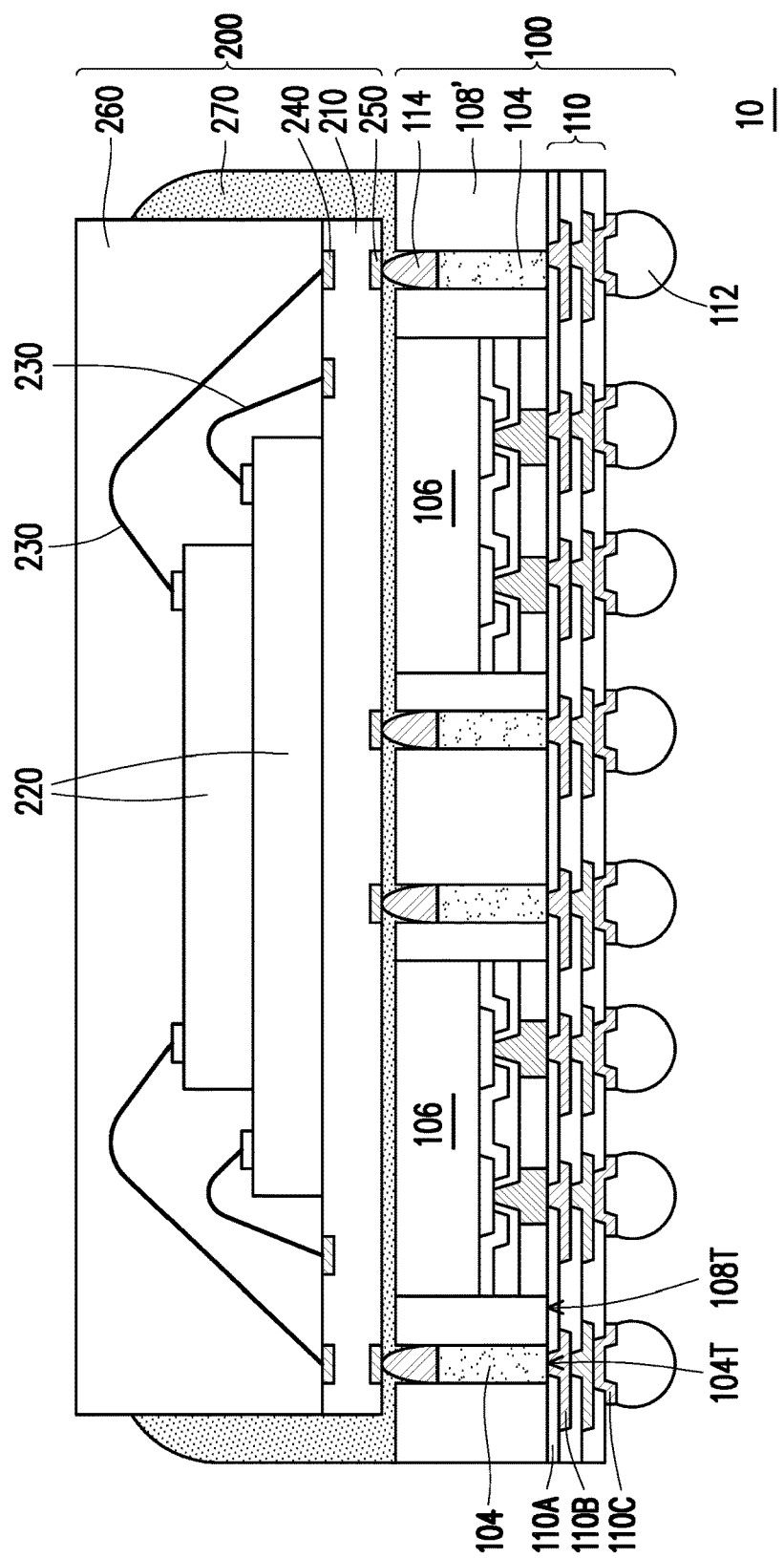

In a next step, as shown in FIG. 10, an underfill structure 270 is formed to fill in the spaces in between the first package structure 100 and the second package structure 200. For example, the underfill structure 270 may fill up the gaps between adjacent conductive terminals 114 and partially encapsulate the conductive terminals 114. In certain embodiments, the underfill structure 270 may also fill into the gaps/voids in the via openings OP not occupied by the conductive terminals 114. After stacking the second package 200 on the first package 100 and providing electrical connection between the packages through the conductive terminals 114, a package-on-package structure 10 can be fabricated. In some embodiments, a dicing process may be performed to cut the whole package structure into individual packages.

Figure 11:
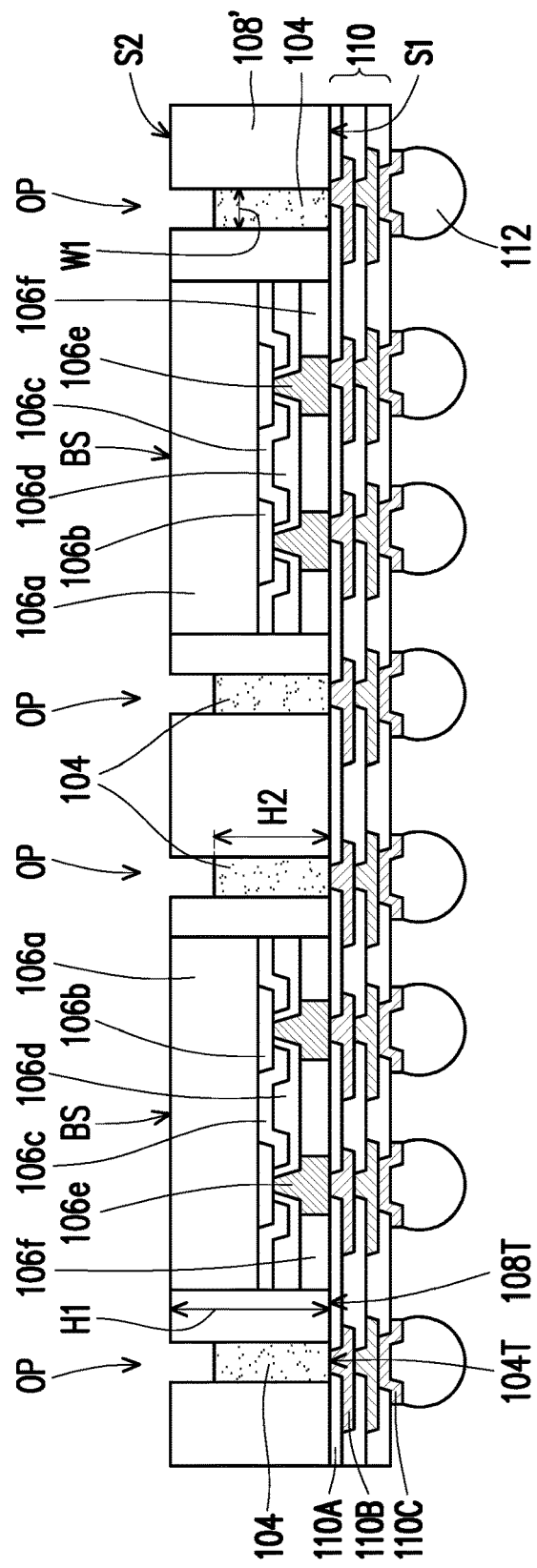
FIG. 11 to FIG. 15 are schematic cross-sectional views of various stages in a manufacturing method of a package-on-package (PoP) structure according to some exemplary embodiments of the present disclosure.

FIG. 11 to FIG. 15 are schematic cross-sectional views of various stages in a manufacturing method of a package-on-package (PoP) structure according to some exemplary embodiments of the present disclosure. The embodiment shown in FIG. 11 to FIG. 15 is similar to the embodiment shown in FIG. 1 to FIG. 10. Hence, the same reference numerals will be used to refer to the same or liked parts, and their detailed description will not be repeated herein. The difference between the embodiment shown in FIG. 11 to FIG. 15 and the embodiment shown in FIG. 1 to FIG. 10 is in the design of the via openings OP on the second surface S2 of the insulating encapsulant 108'. As shown in FIG. 11, the same manufacturing steps up till FIG. 7A are performed to form the plurality of via openings OP. For example, the via openings OP are formed by performing an etching process to remove portions of the through insulator vias 104, and to reduce a height of the through insulator vias 104.

Figure 12A:
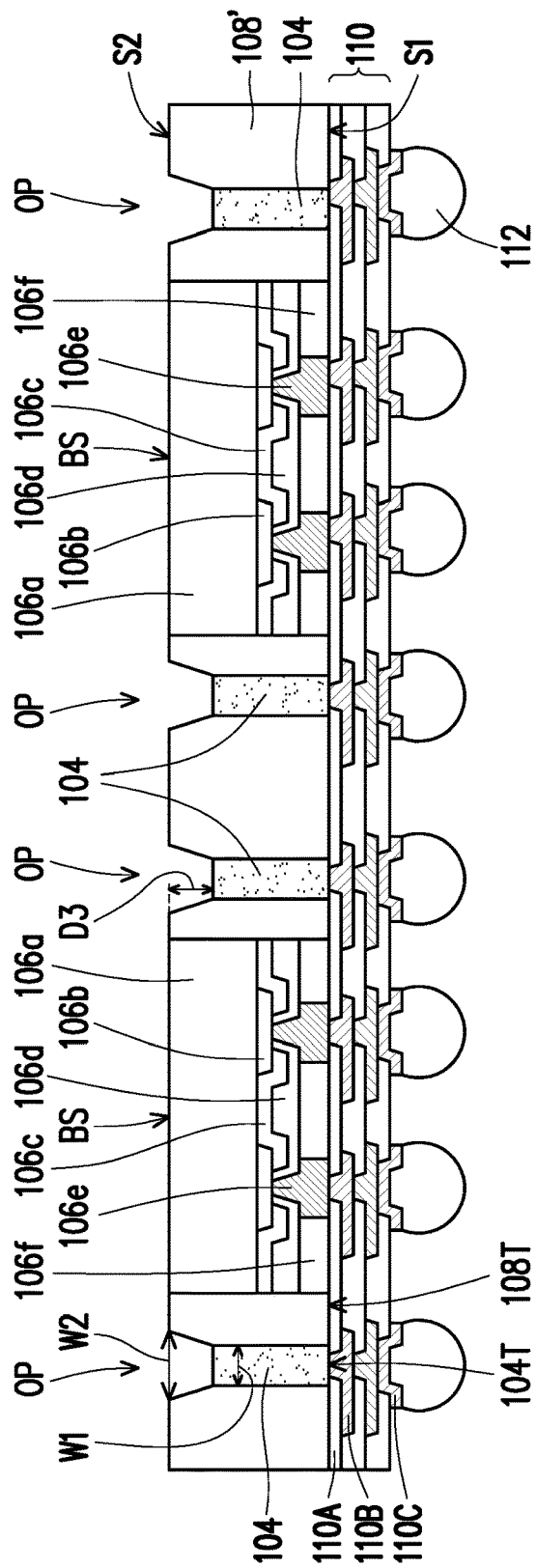
Figure 12B:
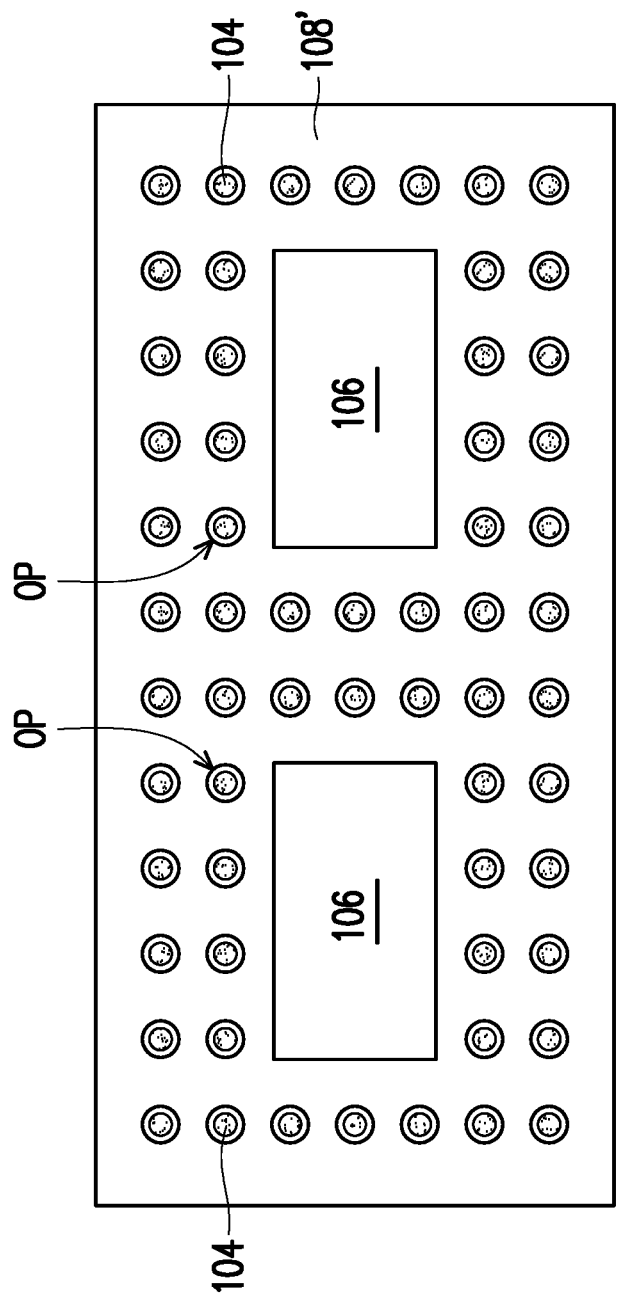

In a next step, as shown in FIG. 12A, the via openings OP are made larger by performing a laser drilling process after the etching process. For example, the laser drilling process may further remove portions of the insulating encapsulant 108'. In some embodiments, after performing the etching and laser drilling process, the remaining through insulator vias 104 has a width of W1, and the via openings OP has a maximum opening width of W2, wherein W1<W2. In other words, the maximum opening width W2 of the via openings OP is larger than the width W1 of the through insulator vias 104. As more clearly illustrated in a top view shown in FIG. 12B (top view of FIG. 12B), the via openings OP reveal each of the through insulator vias 104, while the through insulator vias 104 has a width that is smaller than the via openings OP. In certain embodiments, a ratio of the width W1 to the width W2 is in a range of 1:1.1 to 1:1.6. In the illustrated embodiment, the via openings OP are designed to have a circular shape with a width larger than the through insulator vias 104. However, the disclosure is not limited thereto, and the design of the via openings OP may be adjusted based on product requirement.

Figure 13:
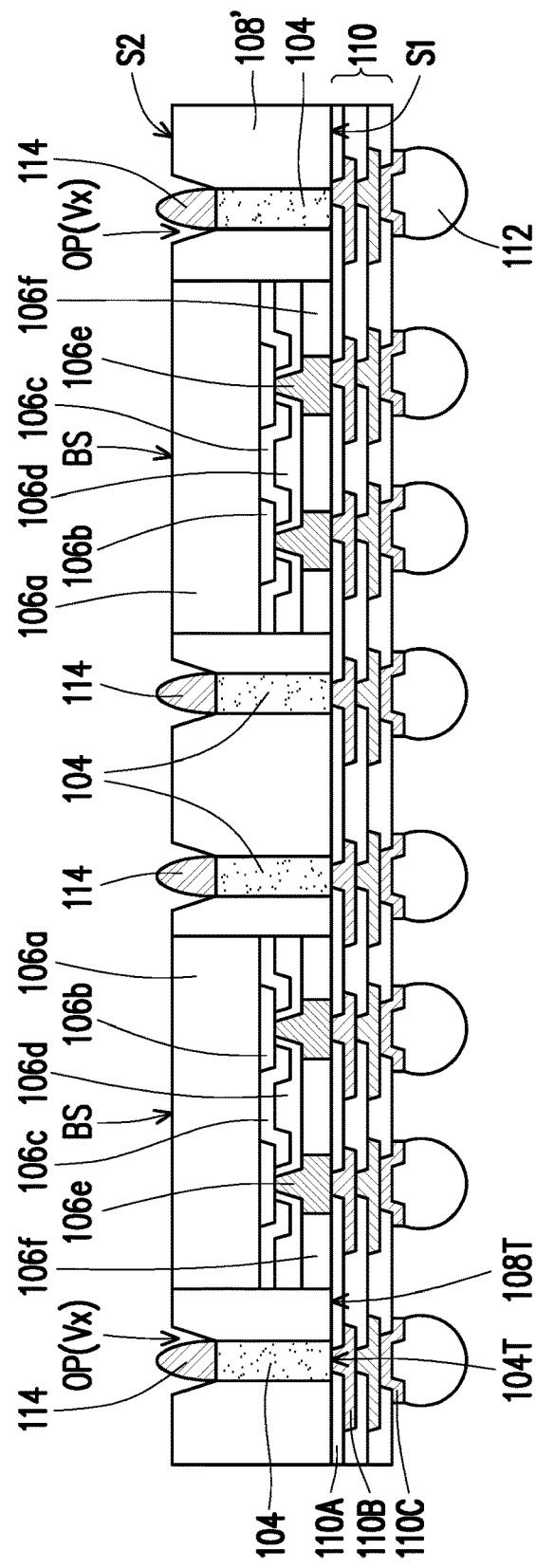

Referring to FIG. 13, after forming the via openings OP, a plurality of conductive terminals 114 is disposed in the via openings OP to provide backside connection. The conductive terminals 114 are disposed in the via openings OP and electrically connected to the plurality of through insulator vias 104. In the illustrated embodiment, since the via openings OP are made with a larger width, there may be voids Vx in the via openings OP existing between the conductive terminals 114 and the insulating encapsulant 108'. That is, voids Vx are the remaining spaces of the via openings OP not occupied by the conductive terminals 114. As shown in FIG. 13, after providing the conductive terminals 114, a first package 100 having dual-side terminals may be accomplished.

Figure 14:
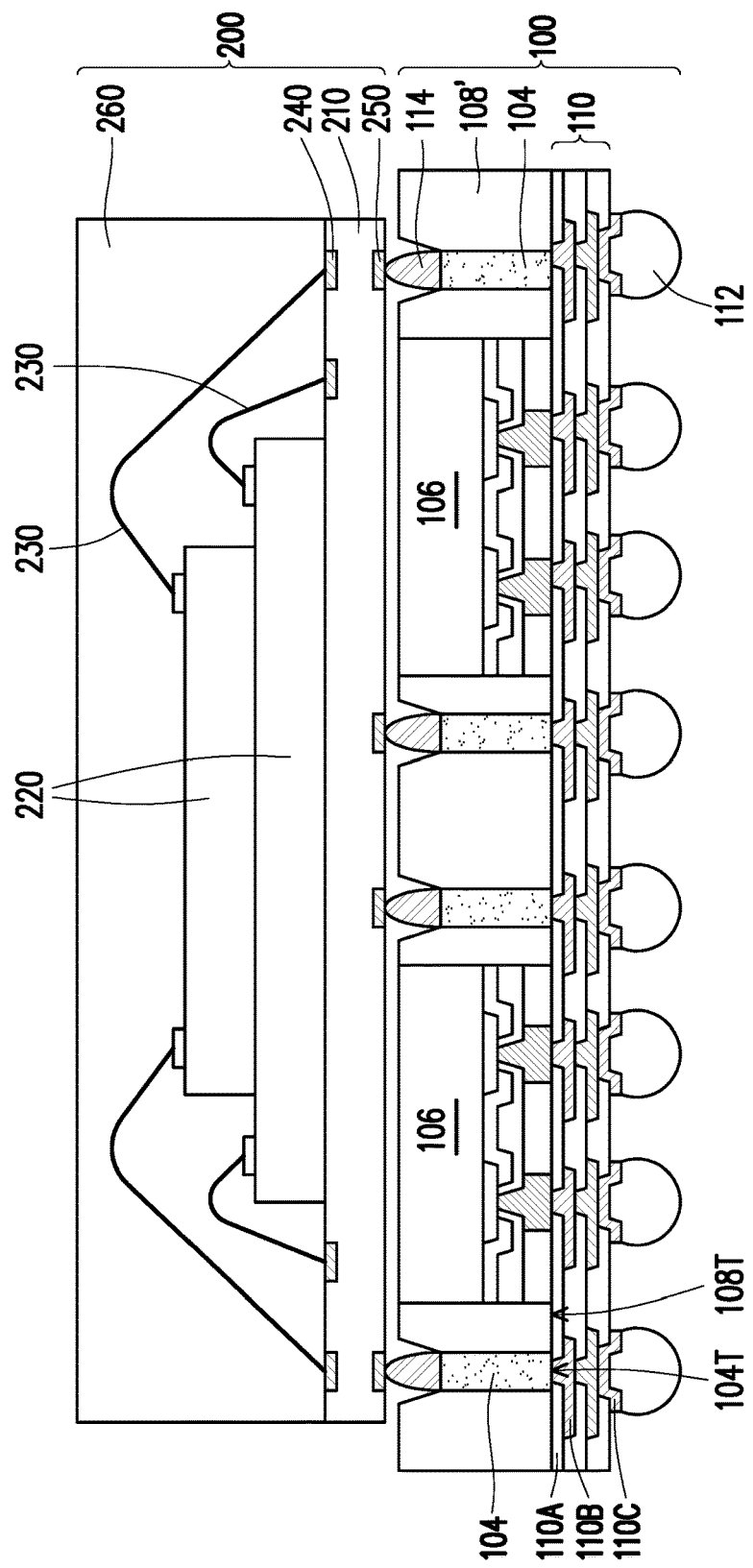
Figure 15:
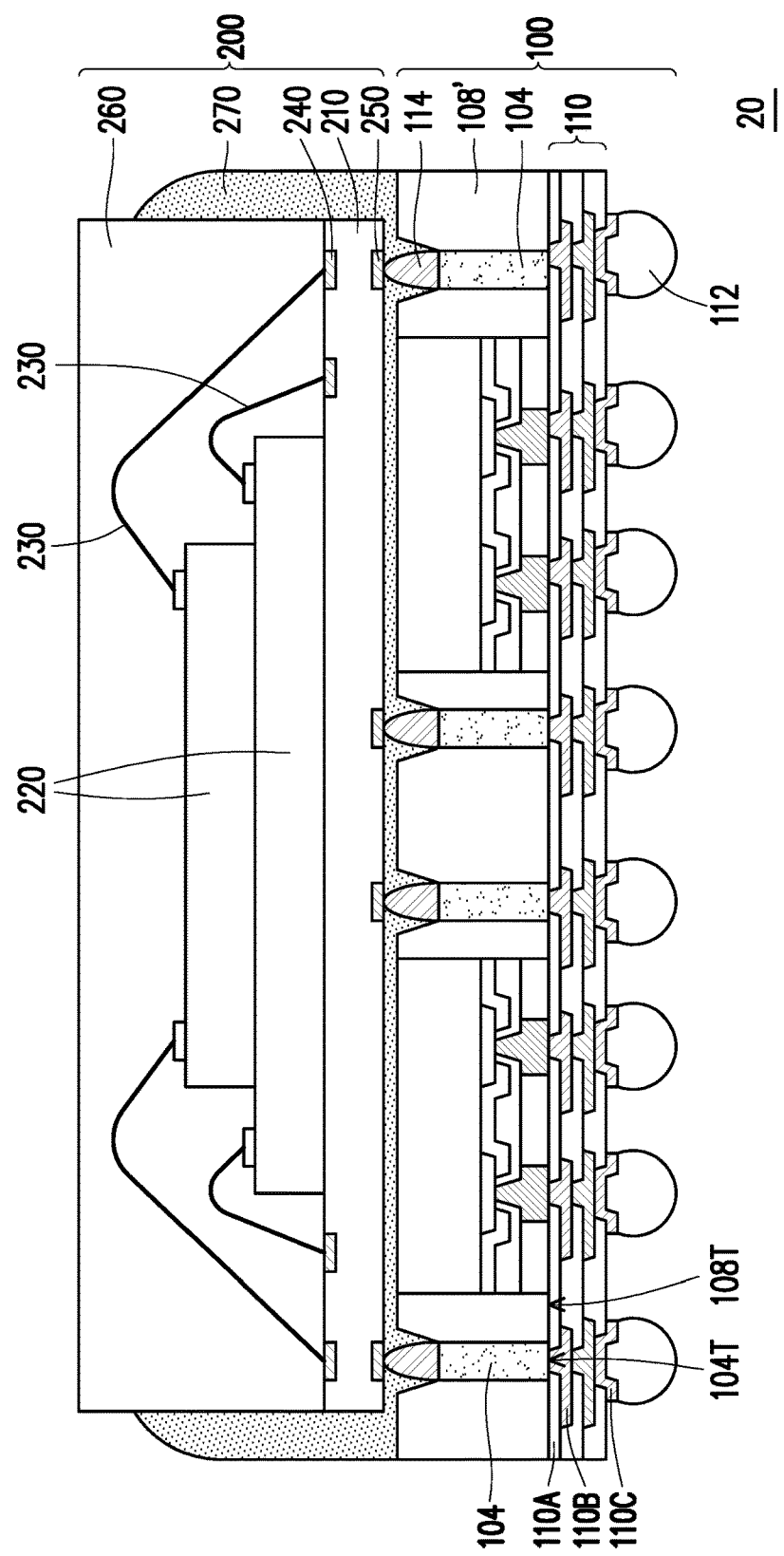

Referring to FIG. 14, after forming the first package 100, a second package 200 is provided and stacked on the first package 100. The second package 200 shown in FIG. 14 is the same as the second package 200 shown in FIG. 9, hence its description will not be repeated herein. In a next step, as shown in FIG. 15, an underfill structure 270 is formed to fill in the spaces in between the first package structure 100 and the second package structure 200. For example, the underfill structure 270 may fill up the gaps between adjacent conductive terminals 114 and partially encapsulate the conductive terminals 114. In some embodiments, the conductive terminals 114 are surrounded by the underfill structure 270 and the insulating encapsulant 108'. Furthermore, the underfill structure 270 may also fill into the voids Vx in the via openings OP not occupied by the conductive terminals 114. By making the width of the via openings OP larger, the underfill structure 270 may better fill up the voids/gaps in between the conductive terminals 114 and the insulating encapsulant 108'. After stacking the second package 200 on the first package 100 and providing electrical connection between the packages through the conductive terminals 114, a package-on-package structure 20 can be fabricated. In some embodiments, a dicing process may be performed to cut the whole package structure into individual packages.

In the above embodiments, a package-on-package structure is provided with a thicker (greater height) semiconductor die to provide better heat dissipation. Furthermore, a height of the through insulator vias are reduced to form a plurality of via openings on the second surface of the insulating encapsulant. As such, the conductive terminals may be disposed within the via openings, and when stacking the second package on the first package, the overall package height may be reduced. Overall, a package-on-package structure with good heat dissipation properties and reduced package height may be obtained.

In some embodiments of the present disclosure, a package-on-package structure including a first package and a second package is provided. The first package includes a semiconductor die, a plurality of through insulator vias, an insulating encapsulant, a plurality of conductive terminals and a redistribution layer. The semiconductor die has an active surface and a backside surface opposite to the active surface, wherein the semiconductor die has a die height H1. The plurality of through insulator vias is surrounding the semiconductor die, wherein the plurality of through insulator vias has a height H2, and H2<H1. The insulating encapsulant is encapsulating the semiconductor die and the plurality of through insulator vias, wherein the insulating encapsulant has a plurality of via openings revealing each of the through insulator vias. The plurality of conductive terminals is disposed in the plurality of via openings and electrically connected to the plurality of through insulator vias. The redistribution layer is disposed on the active surface of the semiconductor die and over the insulating encapsulant. The second package is stacked on the first package and electrically connected to the plurality of conductive terminals of the first package.

In some other embodiments of the present disclosure, a method of manufacturing a package-on-package structure is described. The method includes the following steps. A first package is formed as follows. A carrier is provided. A plurality of through insulator vias is formed on the carrier. A semiconductor die is bonded on the carrier, wherein the plurality of through insulator vias surrounds the semiconductor die. An insulating encapsulant is formed on the carrier to encapsulate the plurality of through insulator vias and the semiconductor die, wherein the insulating encapsulant has a first surface and a second surface opposite to the first surface. A redistribution layer is formed on the semiconductor die and over the first surface of the insulating encapsulant. The carrier is de-bonded. Portions of the plurality of through insulator vias is removed to form a plurality of via openings on the second surface of the insulating encapsulant, wherein the plurality of via openings reveal each of the through insulator vias. A plurality of conductive terminals is provided in the plurality of via openings, wherein the plurality of conductive terminals is electrically connected to the plurality of through insulator vias. A second package is stacked on the first package, wherein the second package is electrically connected to the plurality of conductive terminals of the first package.

In yet another embodiment of the present disclosure, a method of manufacturing a package-on-package structure is described. The method includes the following steps. A first package is formed as follows. A carrier is provided. A plurality of through insulator vias is formed on the carrier. A semiconductor die is bonded on the carrier, wherein the semiconductor die has a die height H1, and the plurality of through insulator vias surrounds the semiconductor die. An insulating encapsulant is formed on the carrier to encapsulate the plurality of through insulator vias and the semiconductor die, wherein the insulating encapsulant has a first surface and a second surface opposite to the first surface. A redistribution layer is formed on the semiconductor die and over the first surface of the insulating encapsulant. The carrier is de-bonded. A height of the plurality of through insulator vias is reduced through an etching process to form a plurality of via openings on the second surface of the insulating encapsulant, wherein the plurality of via openings reveal each of the through insulator vias, the plurality of via openings has a depth D3, and a ratio of the die height H1 to the depth D3 is in a range of 1:0.13 to 1:0.32. A plurality of conductive terminals is provided in the plurality of via openings, wherein the plurality of conductive terminals is electrically connected to the plurality of through insulator vias. A second package is stacked on the first package, wherein the second package is electrically connected to the plurality of conductive terminals of the first package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a package-on-package structure, comprising:
   forming a first package, comprising:
   providing a carrier;
   forming a plurality of through insulator vias on the carrier;
   bonding a semiconductor die on the carrier, wherein the plurality of through insulator vias surrounds the semiconductor die;
   forming an insulating encapsulant on the carrier to encapsulate the plurality of through insulator vias and the semiconductor die, wherein the insulating encapsulant has a first surface and a second surface opposite to the first surface;
   forming a redistribution layer on the semiconductor die and over the first surface of the insulating encapsulant;
   de-bonding the carrier;
   removing portions of the plurality of through insulator vias to form a plurality of via openings on the second surface of the insulating encapsulant, wherein the plurality of via openings reveal each of the through insulator vias; and providing a plurality of conductive terminals in the plurality of via openings, wherein the plurality of conductive terminals is electrically connected to the plurality of through insulator vias;

stacking a second package on the first package, wherein the second package is electrically connected to the plurality of conductive terminals of the first package.

2. The method according to claim 1, wherein the portions of the plurality of through insulator vias are removed by performing an etching process to form the plurality of via openings.

3. The method according to claim 2, further comprises performing a laser drilling process after the etching process to form the plurality of via openings.

4. The method according to claim 3, wherein the etching process and the laser drilling process further removes portions of the insulating encapsulant.

5. The method according to claim 3, wherein the plurality of through insulator vias has a width of W1, and the plurality of via openings has a maximum opening width of W2 after performing the etching process and the laser drilling process, and W1<W2.

6. The method according to claim 1, wherein the semiconductor die has a die height H1, the plurality of via openings has a depth D3, and a ratio of the die height H1 to the depth D3 is in a range of 1:0.13 to 1:0.32.

7. The method according to claim 1, further comprises forming an underfill structure filling spaces in between the first package structure and the second package structure.

8. The method according to claim 7, wherein the underfill structure is formed to fill into the plurality of via openings and to surround the plurality of conductive terminals.

9. A method of manufacturing a package-on-package structure, comprising:
  forming a first package, comprising:
    providing a carrier;
    forming a plurality of through insulator vias on the carrier;
    bonding a semiconductor die on the carrier, wherein the semiconductor die has a die height H1, and the plurality of through insulator vias surrounds the semiconductor die;
    forming an insulating encapsulant on the carrier to encapsulate the plurality of through insulator vias and the semiconductor die, wherein the insulating encapsulant has a first surface and a second surface opposite to the first surface;
    forming a redistribution layer on the semiconductor die and over the first surface of the insulating encapsulant;
    de-bonding the carrier;
    reducing a height of the plurality of through insulator vias through an etching process to form a plurality of via openings on the second surface of the insulating encapsulant, wherein the plurality of via openings reveal each of the through insulator vias, the plurality of via openings has a depth D3, and a ratio of the die height H1 to the depth D3 is in a range of 1:0.13 to 1:0.32; and
    providing a plurality of conductive terminals in the plurality of via openings, wherein the plurality of conductive terminals is electrically connected to the plurality of through insulator vias;

stacking a second package on the first package, wherein the second package is electrically connected to the plurality of conductive terminals of the first package.

10. The method according to claim 9, further comprises performing a laser drilling process after the etching process to form the plurality of via openings.

11. The method according to claim 9, wherein the plurality of through insulator vias has a width of W1, and the plurality of via openings has a maximum opening width of W2 after performing the etching process, and W1≤W2.

12. The method according to claim 11, wherein a ratio of the width W1 to the width W2 is in a range of 1:1.1 to 1:1.6.

13. The method according to claim 9, further comprises forming an underfill structure filling spaces in between the first package structure and the second package structure.

14. A method of manufacturing a package structure, comprising:
  providing a plurality of through insulator vias and at least one semiconductor die on a carrier, wherein the plurality of through insulator vias surrounds the semiconductor die;
  forming an insulating encapsulant on the carrier to encapsulate the plurality of through insulator vias and the semiconductor die;
  forming a redistribution layer on the semiconductor die and over the insulating encapsulant;
  de-bonding the carrier to reveal portions of the plurality of through insulator vias;
  reducing a height of the plurality of through insulator vias by performing an etching process at the revealed portions of the plurality of through insulator vias; and
  providing a plurality of conductive terminals electrically connected to the plurality of through insulator vias.

15. The method according to claim 14, further comprises performing a laser drilling process after the etching process to form a plurality of via openings on the insulating encapsulant, wherein the plurality of conducive terminals is placed in the plurality of via openings.

16. The method according to claim 15, wherein the etching process and the laser drilling process further removes portions of the insulating encapsulant.

17. The method according to claim 15, wherein the plurality of through insulator vias has a width of W1, and the plurality of via openings has a maximum opening width of W2 after performing the etching process and the laser drilling process, and W1<W2.

18. The method according to claim 15, wherein the semiconductor die has a die height H1, the plurality of via openings has a depth D3, and a ratio of the die height H1 to the depth D3 is in a range of 1:0.13 to 1:0.32.

19. The method according to claim 14, wherein the plurality of through insulator vias has a width of W1, and the plurality of via openings has a maximum opening width of W2 after performing the etching process, and W1=W2.

20. The method according to claim 14, wherein the plurality of conductive terminals is placed on the plurality of through insulator vias in a way that a portion of the plurality of conductive terminals is surrounded by the insulating encapsulant, and another portion of the plurality of conductive terminals is protruding out from the insulating encapsulant.

* * * * *